United States Patent
Qin et al.

(10) Patent No.: US 12,183,868 B2
(45) Date of Patent: Dec. 31, 2024

(54) INTEGRATED CHIP AND MANUFACTURING METHOD THEREFOR, AND FULL-COLOR INTEGRATED CHIP AND DISPLAY PANEL

(71) Applicant: FOSHAN NATIONSTAR OPTOELECTRONICS CO., LTD., Foshan (CN)

(72) Inventors: Kuai Qin, Foshan (CN); Heng Guo, Foshan (CN); Kailiang Fan, Foshan (CN); Caineng Huo, Foshan (CN); Zhuang Peng, Foshan (CN)

(73) Assignee: FOSHAN NATIONSTAR OPTOELECRONICS CO., LTD., Foshan (CN)

( * ) Notice: Subject to any disclaimer, the term of this patent is extended or adjusted under 35 U.S.C. 154(b) by 430 days.

(21) Appl. No.: 17/788,151

(22) PCT Filed: Dec. 18, 2020

(86) PCT No.: PCT/CN2020/137776
§ 371 (c)(1),
(2) Date: Jun. 22, 2022

(87) PCT Pub. No.: WO2021/129542
PCT Pub. Date: Jul. 1, 2021

(65) Prior Publication Data
US 2023/0029972 A1    Feb. 2, 2023

(30) Foreign Application Priority Data
Dec. 25, 2019 (CN) .......................... 201911358755.8
Dec. 25, 2019 (CN) .......................... 201922390051.0

(51) Int. Cl.
*H01L 33/62*    (2010.01)
*H01L 23/544*    (2006.01)
(Continued)

(52) U.S. Cl.
CPC ............ *H01L 33/62* (2013.01); *H01L 23/544* (2013.01); *H01L 25/0753* (2013.01);
(Continued)

(58) Field of Classification Search
CPC ......... H01L 33/62; H01L 33/32; H01L 33/44; H01L 33/46; H01L 33/502; H01L 25/0753
See application file for complete search history.

(56) References Cited

U.S. PATENT DOCUMENTS 9,980,341 B2 *    5/2018  Bower ................... H05B 45/20
10,468,391 B2 *  11/2019  Cok ..................... H01L 25/0753
(Continued)

FOREIGN PATENT DOCUMENTS

CN    104465485 A    3/2015
CN    204614809 U    9/2015
(Continued)

OTHER PUBLICATIONS

Gao, Hongwei, et. al., Electronic Packaging Technology and Equipment Technology Basic Course, Core course planning textbook for electronic packaging technology major, Jun. 30, 2017, Xidian University Press, http://www.xduph.com, China.
(Continued)

*Primary Examiner* — Mark W Tornow
(74) *Attorney, Agent, or Firm* — CM Law; Stephen J. Weed

(57) ABSTRACT

A manufacturing method for an integrated chip is used for forming and processing an electrode structure of the integrated chip. The method includes step S1 and step S2. In step S1, a light-emitting portion is manufactured, and the light-emitting portion includes multiple light-emitting unit groups distributed in the form of a matrix. In step S2, conductive terminals multiple first electrodes and conductive terminals of multiple second electrodes of the light-emitting portion are electrically led out to form multiple first pin electrodes and multiple second pin electrodes. The first pin electrodes and the second pin electrodes are used for being electrically connected to a circuit substrate.

20 Claims, 9 Drawing Sheets

(51) Int. Cl.
*H01L 25/075* (2006.01)
*H01L 33/32* (2010.01)
*H01L 33/44* (2010.01)
*H01L 33/46* (2010.01)
*H01L 33/50* (2010.01)

(52) U.S. Cl.
CPC .............. *H01L 33/32* (2013.01); *H01L 33/44* (2013.01); *H01L 33/46* (2013.01); *H01L 33/502* (2013.01); *H01L 2223/54406* (2013.01); *H01L 2933/0066* (2013.01)

(56) References Cited

U.S. PATENT DOCUMENTS

| | | | |
|---|---|---|---|
| 10,714,001 B2* | 7/2020 | Cok | H01L 27/156 |
| 2014/0267683 A1* | 9/2014 | Bibl | G09G 3/006 |
| | | | 348/87 |
| 2019/0355294 A1* | 11/2019 | Gu | G09G 3/32 |
| 2020/0083420 A1* | 3/2020 | Gu | H01L 23/5384 |

FOREIGN PATENT DOCUMENTS

| | | |
|---|---|---|
| CN | 204809226 U | 11/2015 |
| CN | 207425855 U | 5/2018 |
| CN | 110190176 A | 8/2019 |
| CN | 111430342 A | 7/2020 |
| CN | 211295128 U | 8/2020 |

OTHER PUBLICATIONS

Translated Chinese First Office Action, App. No. 201911358755.8, pp. 1-8.
Translated Chinese First Search Report, App. No. 201911358755.8, p. 1.
International Search Report, PCT/CN2020/13776, filed Dec. 18, 2020, pp. 1-5, Mailing date of search report, Mar. 17, 2021.
Translated International Search Report, PCT/CN/2020/137776, filed Dec. 18, 2020, Mailing date of search report. Mar. 17, 2021.

* cited by examiner

INTEGRATED CHIP AND MANUFACTURING METHOD THEREFOR, AND FULL-COLOR INTEGRATED CHIP AND DISPLAY PANEL

CROSS-REFERENCE TO RELATED APPLICATION(S)

This is a national stage application filed under 37 U.S.C. 371 based on International Patent Application No. PCT/CN2020/137776, filed Dec. 18, 2020, which claims priority to Chinese Patent Application No. 201911358755.8 filed with the China National Intellectual Property Administration (CNIPA) on Dec. 25, 2019 and titled "INTEGRATED CHIP AND MANUFACTURING METHOD THEREFOR, FULL-COLOR INTEGRATED CHIP AND DISPLAY PANEL" and Chinese Patent Application No. 201922390051.0 filed with the China National Intellectual Property Administration (CNIPA) on Dec. 25, 2019 and titled "INTEGRATED CHIP, FULL-COLOR INTEGRATED CHIP AND DISPLAY PANEL".

This application claims priority to Chinese Patent Application No. 201911358755.8 filed with the China National Intellectual Property Administration (CNIPA) on Dec. 25, 2019 and titled "INTEGRATED CHIP AND MANUFACTURING METHOD THEREFOR, FULL-COLOR INTEGRATED CHIP AND DISPLAY PANEL" and Chinese Patent Application No. 201922390051.0 filed with the China National Intellectual Property Administration (CNIPA) on Dec. 25, 2019 and titled "INTEGRATED CHIP, FULL-COLOR INTEGRATED CHIP AND DISPLAY PANEL".

TECHNICAL FIELD

The present disclosure relates to the field of display technology and, specifically, to an integrated chip and a manufacturing method therefor, a full-color integrated chip and a display panel.

BACKGROUND

As an emerging display technology, microLED display has clear advantages over LCD and OLED in terms of a high brightness, a fast response time, a high resolution, a high color gamut and a long service life. Thus, microLED display brings a technological innovation revolution to the field of display technology.

In the manufacturing process of a microLED display panel, a large number of chips need to be laid on a circuit substrate in sequence by being transferred. Frequent chip transfer operations result in a complex manufacturing process of the display panel. The complex manufacturing process not only greatly reduces the production and processing efficiency of the display panel and affects the production schedule of a display screen, but also reduces the qualification rate of the finished product of the display panel due to the low yield of the laid chips, resulting in the low production efficiency of the display screen.

Additionally, when the size of a light-emitting chip is small, the spacing between the positive electrode and negative electrode of the light-emitting chip becomes small, and the requirements for the processing accuracy and the die attach process of a circuit substrate are increased. At the same time, when the size of a single light-emitting chip is small, since each light-emitting chip has a positive electrode and a negative electrode, each light-emitting chip needs to be independently controlled. As a result, when the number of light-emitting chips on a substrate is large, the design complexity of the circuit substrate increases, and the design difficulty of the substrate increases.

SUMMARY

The main object of the present disclosure is to provide an integrated chip and a manufacturing method therefor, a full-color integrated chip and a display panel to solve the problem that the complex manufacturing process of a microLED display panel in the existing art not only greatly reduces the production and processing efficiency of the display panel and affects the production schedule of a display screen, but also reduces the qualification rate of the finished product of the display panel due to the low yield of the laid chips, resulting in the low production efficiency of the display screen. Additionally, an integrated chip adopts a common electrode structure. Compared with a conventional light-emitting chip which adopts an independent electrode, the whole number of electrodes of the integrated chip is reduced, and the area of a single electrode is increased. The integrated chip has the characteristics of a small number of wirings, low transfer difficulty, low design difficulty of a circuit substrate of a display panel and a low requirement for the processing accuracy of the circuit substrate and has good practicability.

To achieve the preceding object, according to an aspect of the present disclosure, a manufacturing method for an integrated chip is provided. The method is used for forming and processing an electrode structure of the integrated chip. The method includes step S1 and step S2. In step S1, a light-emitting portion is manufactured, and the light-emitting portion includes n×m light-emitting unit groups distributed in the form of a matrix. n denotes the number of rows. m denotes the number of columns. n and m are each a positive integer greater than or equal to 1. Each light-emitting unit group includes x×y light-emitting units distributed in the form of a matrix. x denotes the number of rows. y denotes the number of columns. x and y are each a positive integer greater than or equal to 1. A light-emitting unit includes electrode a and electrode b. Electrodes a of the same column of light-emitting units in the same column of light-emitting unit groups are electrically connected to form the same first electrode so that a total of m×y first electrodes are formed, and electrodes b of the same row of light-emitting units in the same row of light-emitting unit groups are electrically connected to form the same second electrode so that a total of n×x second electrodes are formed. In step S2, conductive terminals of the m×y first electrodes and conductive terminals of the n×x second electrodes are electrically led out so that m×y first pin electrodes and n×x second pin electrodes are formed. The first pin electrodes and the second pin electrodes are used for being electrically connected to a circuit substrate.

Further, the electrodes a of the same column of light-emitting units in the same column of light-emitting unit groups are electrically connected by evaporation or deposition to form the same first electrode so that a total of m×y first electrodes are formed.

The electrodes b of the same row of light-emitting units in the same row of light-emitting unit groups are electrically connected by evaporation or deposition to form the same second electrode so that a total of n×x second electrodes are formed.

Further, step S2 includes step S21 and step S22. In step S21, conductive terminals of the m×y first electrodes are electrically led out towards the edges of the integrated chip so that the m×y first pin electrodes are formed. In step S22, conductive terminals of the n×x second electrodes are electrically led out towards the edges of the integrated chip so that the n×x second pin electrodes are formed, and the m×y first pin electrodes and the n×x second pin electrodes are sequentially distributed at intervals along the edges of the integrated chip.

Further, in step S22, each of m and n is set to 2, x is set to 3, and y is set to 1. Conductive terminals of two first electrodes and six second electrodes are led out towards the edges of the integrated chip so that two first pin electrodes and six second pin electrodes are formed.

Further, in step S2, N insulating protective layers are formed on the surface of the first electrodes and the second electrodes of the light-emitting portion by deposition or evaporation. N metal wiring layers are sequentially formed, by evaporation or deposition, on surfaces of the N insulating protective layers facing away from the first electrodes and the second electrodes, and one metal wiring layer is formed on the surface of one insulating protective layer facing away from the first electrodes and the second electrodes. The first electrodes and the second electrodes are electrically connected to the N metal wiring layers through metal vias in the insulating protective layers. N is a positive integer greater than or equal to 2.

Further, an insulating layer is disposed on the side of the Nth metal wiring layer facing away from the N insulating protective layers. The insulating layer covers the metal wiring on the Nth metal wiring layer and metal vias in the Nth metal wiring layer.

Further, the Nth metal wiring layer includes the m×y first pin electrodes and the n×x second pin electrodes.

Further, an identification mark for identifying the polarity of a first pin electrode or the polarity of a second pin electrode is disposed on an insulating protective layer in contact with the Nth metal wiring layer.

Further the insulating protective layers are silicon dioxide layers or silicon nitride layers.

Further the insulating protective layers are formed by printing or deposition or evaporation. According to another aspect of the present disclosure, an integrated chip is provided. The integrated chip is manufactured by the preceding manufacturing method for an integrated chip.

According to another aspect of the present disclosure, an integrated chip is provided. The integrated chip includes a light-emitting portion and a pin portion. The light-emitting portion includes a light-emitting layer and an electrode structure. The electrode structure is electrically connected to the light-emitting layer. The pin portion is disposed below the electrode structure and electrically connected to the electrode structure. The pin portion includes N metal wiring layers and N insulating protective layers stacked in sequence. One insulating protective layer is disposed between the electrode structure and one metal wiring layer adjacent to the electrode structure. One insulating protective layer is disposed between two adjacent metal wiring layers. Metal vias for conductors to pass through are formed in the insulating protective layers. The N metal wiring layers are electrically connected by the conductors, and N≥2.

Further, the light-emitting layer includes the n×m light-emitting unit groups distributed in a matrix. n denotes the number of rows. m denotes the number of columns. n and m are each a positive integer greater than or equal to 1. A light-emitting unit group includes the x×y light-emitting units distributed in a matrix. x denotes the number of rows. y denotes the number of columns. x and y are each a positive integer greater than or equal to 1. The electrode structure includes electrode groups electrically connected to a plurality of light-emitting units in a one-to-one correspondence. Each electrode group includes electrode a and electrode b. Electrodes a of the same column of light-emitting units in the same column of light-emitting unit groups are electrically connected to form the same first electrode so that a total of m×y first electrodes are formed, and electrodes b of the same row of light-emitting units in the same row of light-emitting unit groups are electrically connected to form the same second electrode so that a total of n×x second electrodes are formed.

Further, the pin portion is formed with the first pin electrodes and the second pin electrodes at the Nth metal wiring layer. The first pin electrodes are the m×y first pin electrodes connected to a plurality of first electrodes in a one-to-one correspondence. The second pin electrodes are the n×x second pin electrodes connected to a plurality of second electrodes in a one-to-one correspondence.

Further, N=2, m=2, n=2, x=3, and y=1.

Further, the identification mark for identifying the polarity of the first pin electrode or the polarity of the second pin electrode is disposed on the insulating protective layer in contact with the Nth metal wiring layer.

Further, the insulating layer is disposed on the side of the Nth metal wiring layer facing away from the N insulating protective layers. The insulating layer covers the metal wiring on the Nth metal wiring layer and the metal vias in the Nth metal wiring layer.

Further, the integrated chip further includes a plurality of light processing portions distributed on the light-emitting portion in the form of a matrix along a light-emitting surface of the integrated chip and located above the light-emitting layer. A plurality of light processing portions are disposed in a one-to-one correspondence with a plurality of light-emitting units. The light-emitting portion further includes a P-GaN layer and a metal contact layer stacked below the light-emitting layer, and the metal contact layer is disposed below the P-GaN layer. The electrode structure includes a positive electrode and a negative electrode. The negative electrode is electrically connected to the light-emitting units. The positive electrode is electrically connected to the light-emitting units through the metal contact layer and the P-GaN layer.

Further, the light-emitting portion further includes an n-GaN layer, a buffer layer and a first passivation layer. The n-GaN layer, the buffer layer and the first passivation layer are stacked between the light-emitting layer and the light processing portion, and the n-GaN layer is disposed above the light-emitting layer, the buffer layer is disposed above the n-GaN layer, and the first passivation layer is disposed above the buffer layer. The light-emitting portion further includes a DBR reflective layer and a second passivation layer. The DBR reflective layer covers the outer peripheral side of the buffer layer, the outer peripheral side of the n-GaN layer, the outer peripheral side of the electrode structure, and the bottom of the metal contact layer. The second passivation layer covers the outer peripheral side of the DBR reflective layer and the bottom of the DBR reflective layer. The second passivation layer is one insulating protective layer.

According to another aspect of the present disclosure, a full-color integrated chip is provided. The full-color integrated chip includes the preceding integrated chip and a light processing portion. The light processing portion is disposed above the integrated chip. The light processing portion includes a red quantum dot primitive, a green quantum dot primitive and a light-transmissive complementary color primitive. A bank is disposed between any two adjacent primitives of the red quantum dot primitive, the green quantum dot primitive and the light-transmissive complementary color primitive.

Further, the integrated chip is a blue light integrated chip, and the light-transmissive complementary color primitive is a transparent scattering quantum dot layer.

Further, the integrated chip is an ultraviolet integrated chip, and the light-transmissive complementary color primitive is a blue quantum dot layer.

According to another aspect of the present disclosure, a display panel is provided. The display panel includes a circuit substrate, a plurality of integrated chips and an encapsulating adhesive layer. The integrated chip is the preceding integrated chip. A plurality of integrated chips are disposed on the circuit substrate in the form of a matrix. The encapsulating adhesive layer covers the circuit substrate and encapsulates a plurality of integrated chips.

According to another aspect of the present disclosure, a display panel is provided. The display panel includes a circuit substrate, a plurality of full-color integrated chips and an encapsulating adhesive layer. The full-color integrated chip is the preceding full-color integrated chip. A plurality of full-color integrated chips are disposed on the circuit substrate in the form of a matrix. The encapsulating adhesive layer covers the circuit substrate and encapsulates a plurality of full-color integrated chips.

In the solution of the present disclosure, a specific manufacturing method for an integrated chip is provided to manufacture an integrated chip having a new structure, and the electrode structure of the integrated chip can be quickly and conveniently manufactured. In this manner, not only the light-emitting characteristics of the integrated chip can be ensured to ensure the light-emitting performance of the display panel, but also the integrated chip has multiple light-emitting points in an integrated form to greatly reduce the number of times of transferring the integrated chip in the process of manufacturing the display panel. Thus, the production and processing efficiency of the display panel is improved, and the production schedule of a display screen is shortened. At the same time, the qualification rate of the finished product of the display panel is prevented from being reduced due to the low yield of the laid chips, and the production efficiency of the display screen is improved. Additionally, the integrated chip adopts a common electrode structure. Compared with a conventional light-emitting chip which adopts an independent electrode the whole number of electrodes of the integrated chip is reduced. The integrated chip has the characteristics of a small number of wiring, low transfer difficulty, low design difficulty of the circuit substrate of the display panel and a low requirement for the processing accuracy of the circuit substrate and has good practicability.

BRIEF DESCRIPTION OF DRAWINGS

Drawings constituting a part of the present application are intended to provide a further understanding of the present invention. Exemplary embodiments and their descriptions are used to explain the present disclosure, and are not intended to improperly limit the present disclosure.

Figure 1:
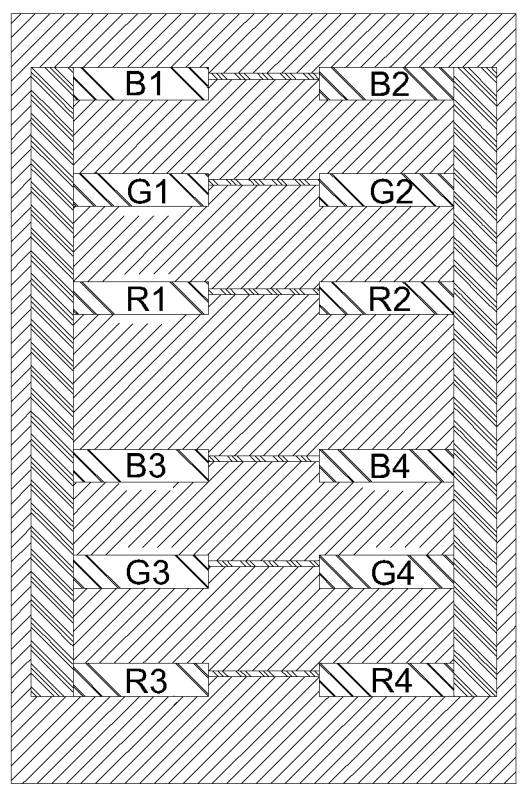
FIG. 1 is a diagram of the distribution state of multiple first electrodes, multiple second electrodes and multiple light-emitting unit groups in the process of manufacturing a light-emitting portion of an integrated chip according to an optional embodiment of the present disclosure.

REFERENCE LIST 1 circuit substrate
2 integrated chip
3 encapsulating adhesive layer
100 light-emitting portion
10 light-emitting layer
20 electrode structure
200 light processing portion
201 red quantum dot primitive
202 green quantum dot primitive
203 light-transmissive complementary color primitive
300 light-blocking layer
301 groove
400 pin portion
11 light-emitting unit group
200 light processing portion
204 light-emitting layer
30 P-GaN layer
40 metal contact layer
21 positive electrode
22 negative electrode
50 n-GaN layer
60 buffer layer
70 first passivation layer
80 DBR reflective layer
90 second passivation layer

DETAILED DESCRIPTION

The solutions in the embodiments of the present disclosure will be described clearly and completely in conjunction with the drawings in the embodiments of the present disclosure. Apparently, the embodiments described are part, not all, of the embodiments of the present disclosure. The description below of at least one exemplary embodiment is in fact merely illustrative and in no way serves as any limitation on the present disclosure and its application or use. Based on the embodiments of the present disclosure, all other embodiments acquired by those of ordinary skill in the art are within the scope of the present disclosure on the premise that no creative work is done.

To solve the problem that the complex manufacturing process of a microLED display panel in the existing art not only greatly reduces the production and processing efficiency of the display panel and affects the production schedule of a display screen, but also reduces the qualification rate of the finished product of the display panel due to the low yield of the laid chips, resulting in the low production efficiency of the display screen, the present disclosure provides an integrated chip and a manufacturing method therefor, a full-color integrated chip and a display panel. It is to be noted that the display panel includes a circuit substrate and multiple integrated chips or multiple full-color integrated chips disposed thereon. The integrated chips are the integrated chips described above and described below, and the full-color integrated chips include the integrated chips described above and described below.

Figure 2:
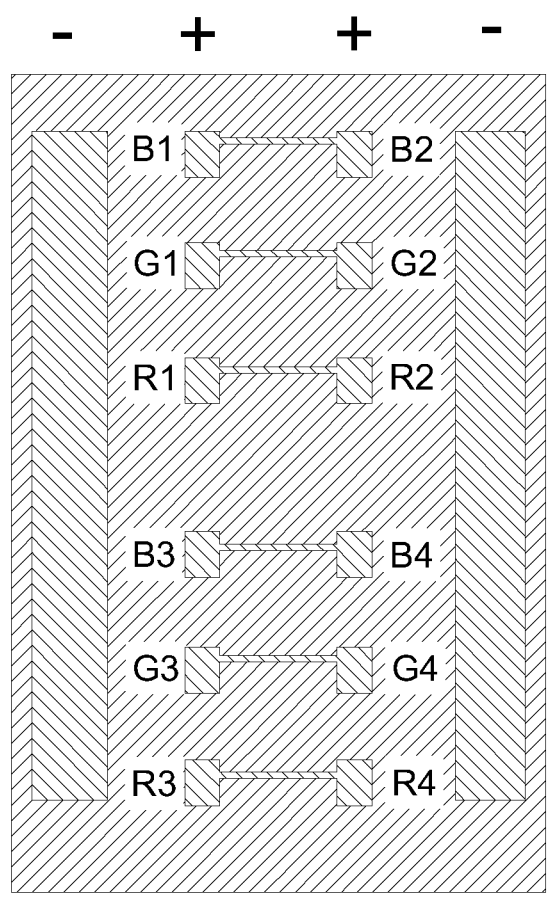
FIG. 2 is a diagram of the distribution state of multiple first electrodes and multiple second electrodes after the multiple light-emitting unit groups in FIG. 1 are covered.

As shown in FIGS. 1 and 2, the manufacturing method for an integrated chip is used for forming and processing an electrode structure of the integrated chip. The method includes step S1 and step S2. In step S1, a light-emitting portion is manufactured, and the light-emitting portion includes n×m light-emitting unit groups distributed in the form of a matrix. n denotes the number of rows. m denotes the number of columns. n and m are each a positive integer greater than or equal to 1. Each light-emitting unit group includes x×y light-emitting units distributed in the form of a matrix. x denotes the number of rows. y denotes the number of columns. x and y are each a positive integer greater than or equal to 1. A light-emitting unit includes electrode a and electrode b. Electrodes a of the same column of light-emitting units in the same column of light-emitting unit groups are electrically connected to form the same first electrode so that a total of m×y first electrodes are formed, and electrodes b of the same row of light-emitting units in the same row of light-emitting unit groups are electrically connected to form the same second electrode so that a total of n×x second electrodes are formed. In step S2, conductive terminals of the m×y first electrodes and conductive terminals of the n×x second electrodes are electrically led out so that m×y first pin electrodes and n×x second pin electrodes are formed. The first pin electrodes and the second pin electrodes are used for being electrically connected to the circuit substrate.

In the present application, a specific manufacturing method for an integrated chip is provided to manufacture an integrated chip having a new structure, and the electrode structure of the integrated chip can be quickly and conveniently manufactured. In this manner, not only the light-emitting characteristics of the integrated chip can be ensured to ensure the light-emitting performance of the display panel, but also the integrated chip has multiple light-emitting points in an integrated form to greatly reduce the number of times of transferring the integrated chip in the process of manufacturing the display panel. Thus, the production and processing efficiency of the display panel is improved, and the production schedule of a display screen is shortened. At the same time, the qualification rate of the finished product of the display panel is prevented from being reduced due to the low yield of the laid chips, and the production efficiency of the display screen is improved. Additionally, the integrated chip adopts a common electrode structure. Compared with a conventional light-emitting chip which adopts an independent electrode, the whole number of electrodes of the integrated chip is reduced. The integrated chip has the characteristics of a small number of wirings, low transfer difficulty, low design difficulty of the circuit substrate of the display panel and a low requirement for the processing accuracy of the circuit substrate and has good practicability.

Optionally, the electrodes a of the same column of light-emitting units in the same column of light-emitting unit groups are electrically connected by evaporation or deposition to form a total of m×y first electrodes are formed. The electrodes b of the same row of light-emitting units in the same row of light-emitting unit groups are electrically connected by evaporation or deposition to form the same second electrode so that a total of n×x second electrodes are formed. In this manner, it is advantageous to control the processing and manufacturing cost of the integrated chip, and the polarity and stability of the first electrodes and the second electrodes can be ensured.

Figure 3:
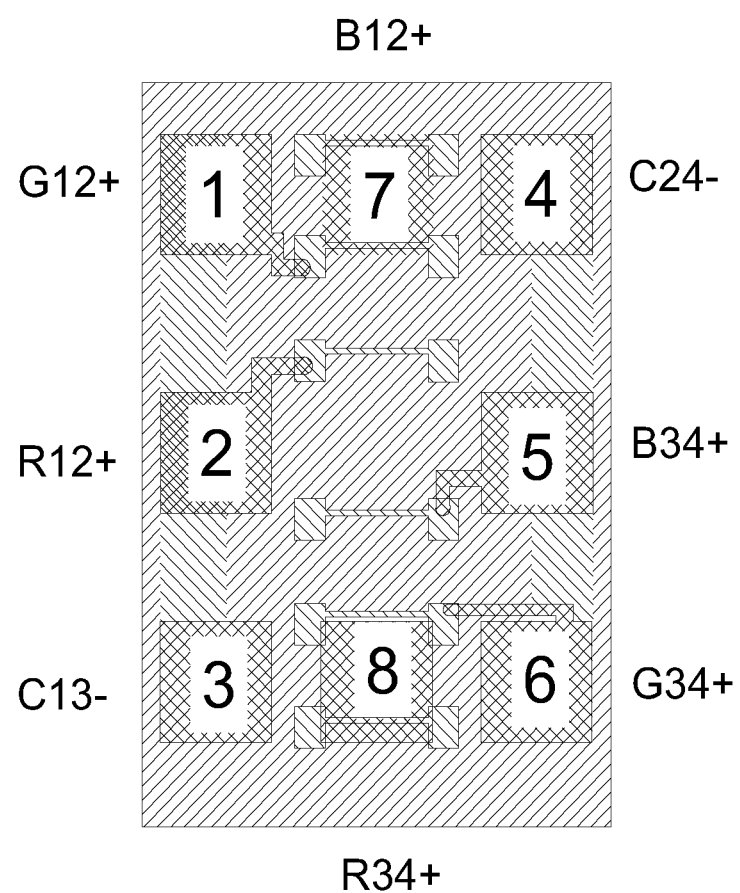
FIG. 3 is a diagram of the distribution state of multiple first pin electrodes and multiple second pin electrodes after conductive terminals of the multiple first electrodes and the multiple second electrodes in FIG. 2 electrically are led out towards the edges of an integrated chip.

As shown in FIG. 3, step S2 includes step S21 and step S22. In step S21, conductive terminals of the m×y first electrodes are electrically led out towards the edges of the integrated chip so that the m×y first pin electrodes are formed. In step S22, conductive terminals of the n×x second electrodes are electrically led out towards the edges of the integrated chip so that the n×x second pin electrodes are formed. The m×y first pin electrodes and the n×x second pin electrodes are sequentially distributed at intervals along the edges of the integrated chip. In this manner, it is convenient to control the spacing distance between two adjacent pin electrodes, avoid the electrical interference between pin electrodes, ensure the stability of the circuit of the integrated chip and improve the imaging reliability of the display panel.

In an illustrated embodiment of the present application, in step S22, each of m and n is set to 2, x is set to 3, and y is set to 1. Conductive terminals of two first electrodes and six second electrodes are led out towards the edges of the integrated chip so that two first pin electrodes and six second pin electrodes are formed. The integrated chip of this structure is not only convenient for processing and manufacturing, but also prone to electrically guide first electrodes and second electrodes to form pin electrodes, thereby ensuring the electrical connection and mounting of the integrated chip.

It is also to be noted that in step S2, N insulating protective layers are formed on the surface of the first electrodes and the second electrodes of the light-emitting portion by deposition or evaporation. N metal wiring layers are sequentially formed, by evaporation or deposition, on surfaces of the N insulating protective layers facing away from the first electrodes and the second electrodes, and one metal wiring layer is formed on the surface of one insulating protective layer facing away from the first electrodes and the second electrodes. The first electrodes and the second electrodes are electrically connected to the N metal wiring layers through metal vias in the insulating protective layers. N is a positive integer greater than or equal to 2. In this manner, it is advantageous to dispose the electrodes of the integrated chip according to design requirements.

In an embodiment of the present application, one insulating protective layer is disposed between electrodes and a metal wiring layer and between two adjacent metal wiring layers.

It is also to be noted that an insulating layer is disposed on the side of the Nth metal wiring layer facing away from the N insulating protective layers, and the insulating layer covers the metal wiring on the Nth metal wiring layer and metal vias in the Nth metal wiring layer. In this manner, it is advantageous for the electrical stability of the integrated chip, and the integrated chip is ensured to be lit stably.

Optionally, the Nth metal wiring layer includes the m×y first pin electrodes and the n×x second pin electrodes. It is also to be noted that the preceding first pin electrodes and second pin electrodes extend out of the insulating layer. In this manner, the multiple pin electrodes can be exposed on the insulating layer, thereby facilitating subsequent connection with other components.

Figure 4:
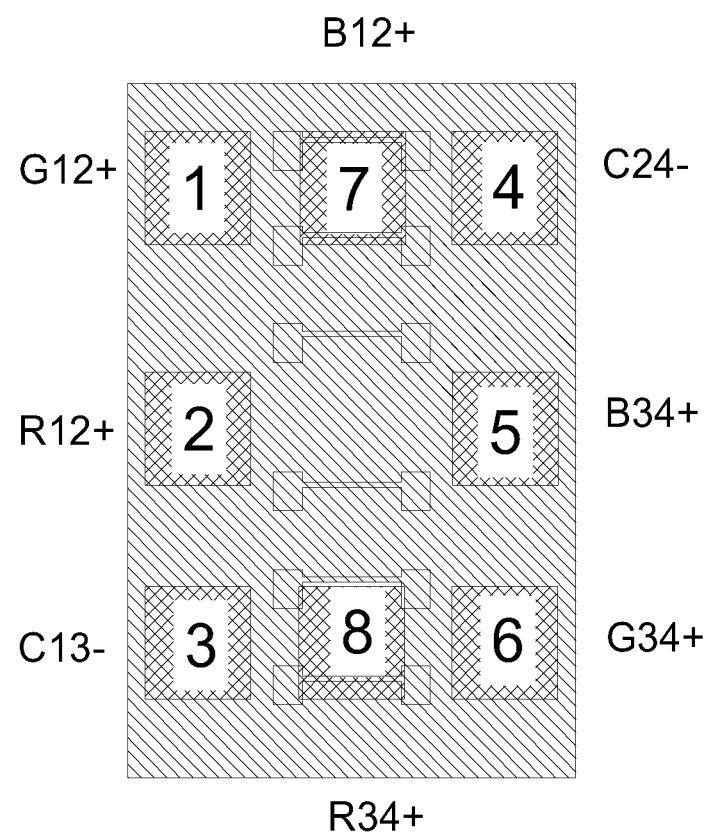
FIG. 4 is a diagram of the distribution state of covered multiple first pin electrodes and covered multiple second pin electrodes after conductive terminals of the multiple first pin electrodes and the multiple second pin electrodes are electrically led out in FIG. 3.
Figure 5:
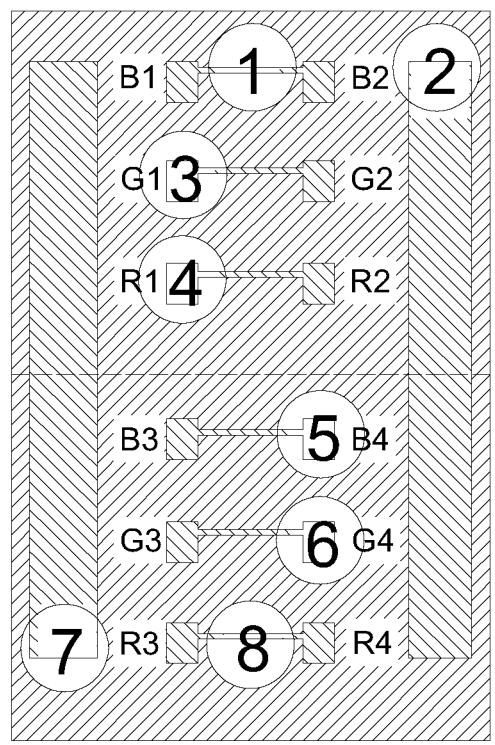
FIG. 5 is a diagram of the distribution state of multiple first pin electrodes and multiple second pin electrodes in the process of manufacturing a light-emitting portion of an integrated chip according to another optional embodiment of the present disclosure.

As shown in FIGS. 4 and 5, an identification mark for identifying the polarity of a first pin electrode or the polarity of a second pin electrode is disposed on an insulating protective layer in contact with the Nth metal wiring layer. In this manner, it is convenient to accurately identify the polarity of the first pin electrodes and the polarity of the second pin electrodes, and at the same time, the position of the first pin electrodes or the position of the second pin electrodes can be accurately known.

In FIG. 4, multiple first pin electrodes and multiple second pin electrodes are distributed at intervals along the edges of the integrated chip. In this figure, two pin electrodes marked 3 and 4 are first pin electrodes, and the first pin electrodes are negative electrodes. Six pin electrodes marked 1, 2 and 5 to 8 are second pin electrodes, and the second pin electrodes are positive electrodes.

In FIG. 5, first pin electrodes are located at the end of the length direction of a first electrode, and second pin electrodes are located at the middle or end of the length direction of a second electrode. In this manner, on the premise that a safety distance can be ensured between two adjacent pin electrodes, the complexity of processing and generating the integrated chip is greatly reduced. In this figure, two pin electrodes marked 2 and 7 are first pin electrodes, and the first pin electrodes are negative electrodes. Six pin electrodes marked 1, 3 to 6 and 8 are second pin electrodes, and the second pin electrodes are positive electrodes.

Optionally, the insulating protective layers are silicon dioxide layers or silicon nitride layers.

In consideration of the economy of the processing and manufacturing of the integrated chip, the insulating protective layers are formed by printing or deposition or evaporation.

In an illustrated embodiment of the present application, the integrated chip is manufactured by the preceding manufacturing method for an integrated chip. A full-color integrated chip includes the preceding integrated chip and a light processing portion. The light processing portion is disposed above the integrated chip. The light processing portion includes a red quantum dot primitive, a green quantum dot primitive and a light-transmissive complementary color primitive. A bank is disposed between any two adjacent primitives of the red quantum dot primitive, the green quantum dot primitive and the light-transmissive complementary color primitive. In this manner, it is ensured that the integrated chip has a characteristic of stably emitting white light.

Optionally, the integrated chip is a blue light integrated chip, and the light-transmissive complementary color primitive is a transparent scattering quantum dot layer.

Apparently, optionally, the integrated chip is an ultraviolet integrated chip, and the light-transmissive complementary color primitive is a blue quantum dot layer.

In an embodiment of an optional display panel of the present application, the display panel includes a circuit substrate, multiple integrated chips and an encapsulating adhesive layer. The integrated chip is the preceding integrated chip. A plurality of integrated chips are disposed on the circuit substrate in the form of a matrix. The encapsulating adhesive layer covers the circuit substrate and encapsulates a plurality of integrated chips.

In an embodiment of another optional display panel of the present application, the display panel includes a circuit substrate, multiple full-color integrated chips and an encapsulating adhesive layer. The full-color integrated chip is the preceding full-color integrated chip. A plurality of full-color integrated chips are disposed on the circuit substrate in the form of a matrix. The encapsulating adhesive layer covers the circuit substrate and encapsulates a plurality of full-color integrated chips.

Figure 6:
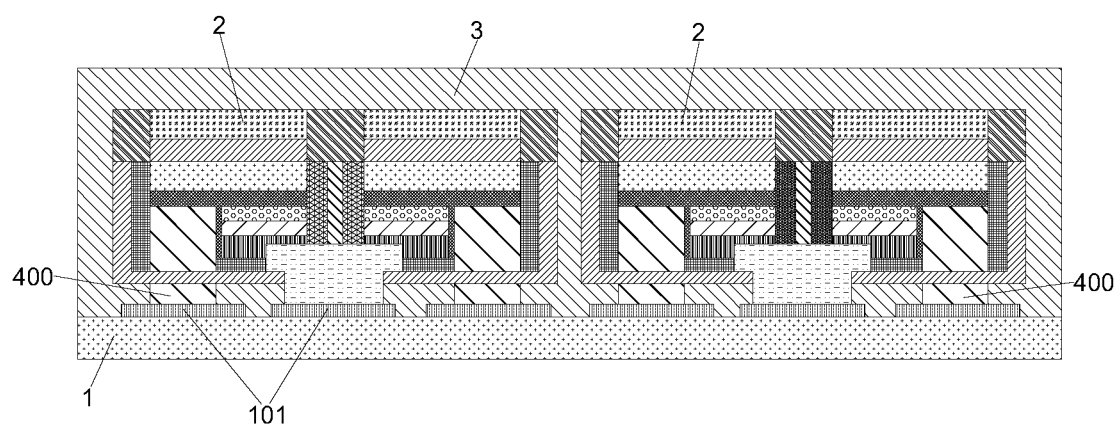
FIG. 6 is a view illustrating the structure of a display panel according to an optional embodiment of the present disclosure.
Figure 7:
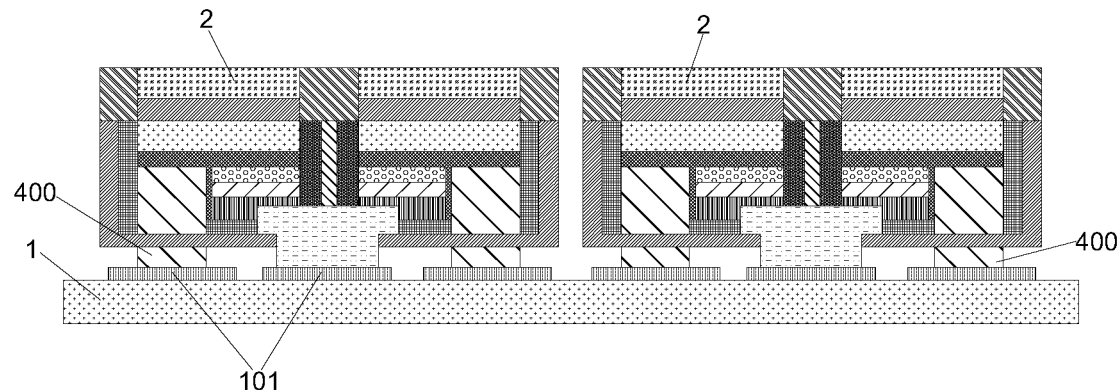
FIG. 7 is a view illustrating the structure of the display panel of FIG. 6 when multiple integrated chips are not encapsulated with an encapsulating adhesive layer.

To solve the problem that the complex manufacturing process of a microLED display panel in the existing art not only greatly reduces the production and processing efficiency of the display panel and affects the production schedule of a display screen, but also reduces the qualification rate of the finished product of the display panel due to the low yield of the laid chips, resulting in the low production efficiency of the display screen, the present disclosure provides an integrated chip. The integrated chip may be manufactured by the preceding manufacturing method for an integrated chip. As shown in FIGS. 6 and 7, the display panel includes a circuit substrate 1 and multiple integrated chips 2 disposed on the circuit substrate 1 in the form of a matrix. In this illustrated embodiment, the integrated chips 2 are the integrated chips 2 described above and described below. In FIG. 6, an encapsulating adhesive layer 3 is disposed, and the encapsulating adhesive layer 3 covers the circuit substrate 1 and encapsulates a plurality of integrated chips 2 to ensure the sealing mounting characteristics of a plurality of integrated chips 2. In an optional embodiment not shown in the present application, the display panel includes a circuit substrate 1 and multiple full-color integrated chips disposed on the circuit substrate 1 in the form of a matrix. Similarly, the full-color integrated chips are the full-color integrated chips described above and described below. Apparently, in this embodiment (not shown), the encapsulating adhesive layer 3 covers the circuit substrate 1 and encapsulates a plurality of full-color integrated chips to ensure the sealing mounting characteristics of a plurality of full-color integrated chips.

As shown in FIGS. 6 to 8 and FIGS. 10 to 12, the integrated chip 2 includes a light-emitting portion 100 and a pin portion 400. The light-emitting portion 100 includes a light-emitting layer 10 and an electrode structure 20. The electrode structure 20 is electrically connected to the light-emitting layer 10. The pin portion 400 is disposed below the electrode structure 20 and electrically connected to the electrode structure 20. The pin portion 400 includes N metal wiring layers and N insulating protective layers stacked in sequence. One insulating protective layer is disposed between the electrode structure 20 and one metal wiring layer adjacent to the electrode structure 20. One insulating protective layer is disposed between two adjacent metal wiring layers. Metal vias for conductors to pass through are formed in the insulating protective layers. The N metal wiring layers are electrically connected by the conductors, and N≥2. In the present disclosure, an integrated chip 2 having a new structure is provided; the specific structure of the pin portion 400 of the integrated chip 2 which electrically interacts with the electrode structure are optimized; and on the premise that the pin portion 400 is prone to be formed and manufactured, not only the electrical connection stability is improved after the integrated chip 2 is mounted, but also a single integrated chip 2 having the pin portion 400 of the present application structure can have more light-emitting points or a larger light-emitting surface. In this manner, it is advantageous to satisfy the preset light-emitting characteristics of the integrated chip 2, and then it is advantageous to reduce the number of integrated chips 2 mounted on the circuit substrate of the display panel, thereby greatly reducing the number of times of transferring the integrated chip 2 in the process of manufacturing the display panel. Thus, the production and processing efficiency of the display panel is improved, and the production schedule of a display screen is shortened. At the same time, the qualification rate of the finished product of the display panel is prevented from being reduced due to the low yield of laid integrated chips 2, and the production efficiency of the display screen is improved. Additionally, the integrated chip 2 adopts a common electrode structure. Compared with a conventional light-emitting chip which adopts an independent electrode, the whole number of electrodes of the integrated chip 2 is reduced. The integrated chip 2 has the characteristics of a small number of wirings, low transfer difficulty, low design difficulty of the circuit substrate 1 of the display panel and a low requirement for the processing accuracy of the circuit substrate 1 and has good practicability.

To improve the light-emitting characteristics of a single integrated chip 2 and control the imaging property of the display panel, optionally, the light-emitting layer 10 includes the n×m light-emitting unit groups 11 distributed in a matrix, n denotes the number of rows, m denotes the number of columns, n and m are each a positive integer greater than or equal to 1, a light-emitting unit group 11 includes the x×y light-emitting units distributed in a matrix, x denotes the number of rows, y denotes the number of columns, and x and y are each a positive integer greater than or equal to 1; the electrode structure 20 includes electrode groups electrically connected to a plurality of light-emitting units in a one-to-one correspondence, and each electrode group includes electrode a and electrode b; and electrodes a of the same column of light-emitting units in the same column of light-emitting unit groups 11 are electrically connected to form the same first electrode so that a total of m×y first electrodes are formed, and electrodes b of the same row of light-emitting units in the same row of light-emitting unit groups 11 are electrically connected to form the same second electrode so that a total of n×x second electrodes are formed. In this manner, it is ensured that the x×y light-emitting units are integrated to form a light-emitting-unit group 11, and multiple light-emitting unit groups 11 are integrated to form an integrated chip 2. When a display panel is manufactured, it is only necessary to transfer multiple integrated chips 2 to a circuit substrate 1 one by one, so that the forming and manufacturing of the display panel can be smoothly achieved.

It is to be noted that the pin portion 400 is formed with the first pin electrodes and the second pin electrodes at the Nth metal wiring layer. The first pin electrodes are the m×y first pin electrodes connected to a plurality of first electrodes in a one-to-one correspondence. The second pin electrodes are the n×x second pin electrodes connected to a plurality of second electrodes in a one-to-one correspondence.

In a preferred embodiment of the present application, an integrated chip 2 having the optimal structure of the light-emitting portion 100 and pin portion 400 is proposed, and N=2, m=2, n=2, x=3, and y=1. That is, the pin portion 400 includes two stacked metal wiring layers and two insulating protective layers. One insulating protective layer is disposed between the electrode structure 20 and the first metal wiring layer adjacent to the electrode structure 20. One insulating protective layer is disposed between two adjacent metal wiring layers. The metal vias for conductors to pass through are formed in the insulating protective layers. The light-emitting layer 10 includes 4 light-emitting unit groups 11 distributed in a matrix. The 4 light-emitting unit groups 11 are distributed in a manner of 2 rows and 2 columns. Each light-emitting unit group 11 includes 3 light-emitting units distributed in a matrix. The 3 light-emitting units are distributed in a manner of 3 rows and 1 column.

To accurately identify the polarity of the first pin electrodes and the polarity of the second pin electrodes to improve the mounting efficiency of the integrated chip 2, optionally, the identification mark for identifying the polarity of the first pin electrode or the polarity of the second pin electrode is disposed on the insulating protective layer in contact with the Nth metal wiring layer.

Optionally, the insulating layer is disposed on the side of the Nth metal wiring layer facing away from the N insulating protective layers, and the insulating layer covers the metal wiring on the Nth metal wiring layer and metal vias in the Nth metal wiring layer.

Figure 8:
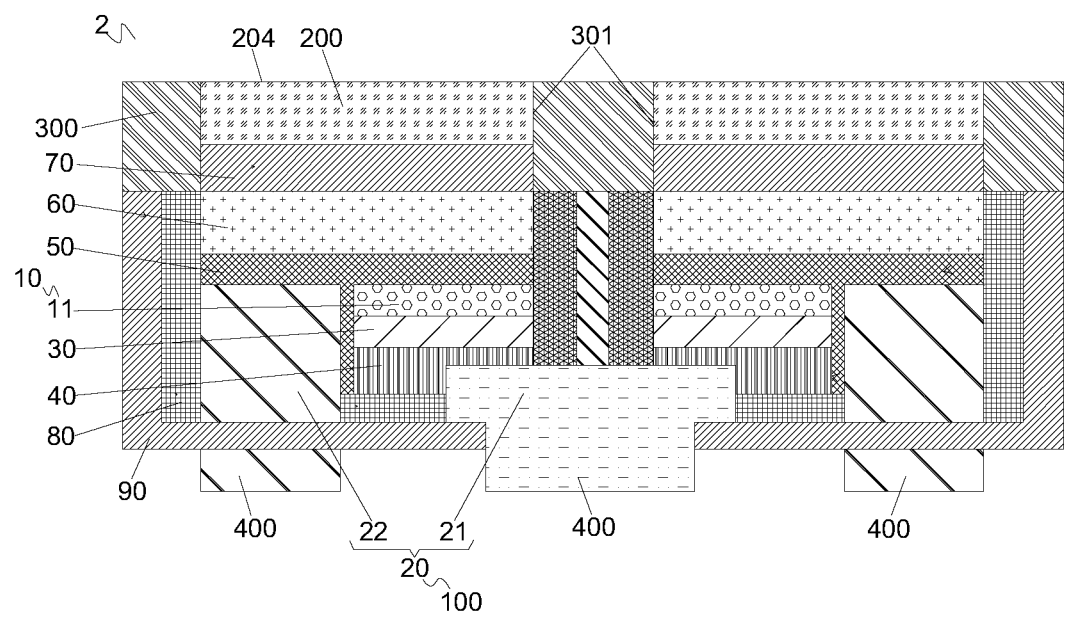
FIG. 8 is a view illustrating the structure of an integrated chip according to an optional embodiment of the present disclosure.
Figure 10:
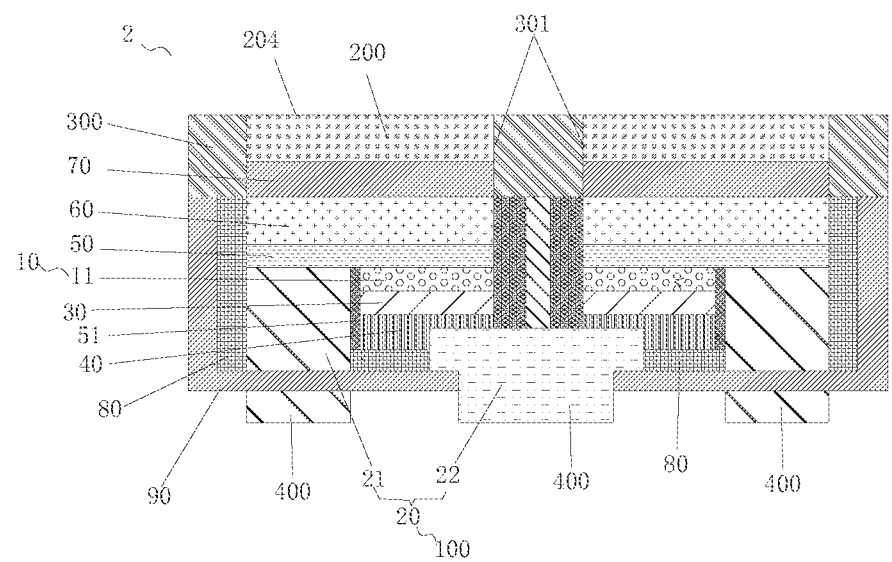
FIG. 10 is a view illustrating the structure of an integrated chip according to an optional embodiment of the present disclosure.
Figure 11:
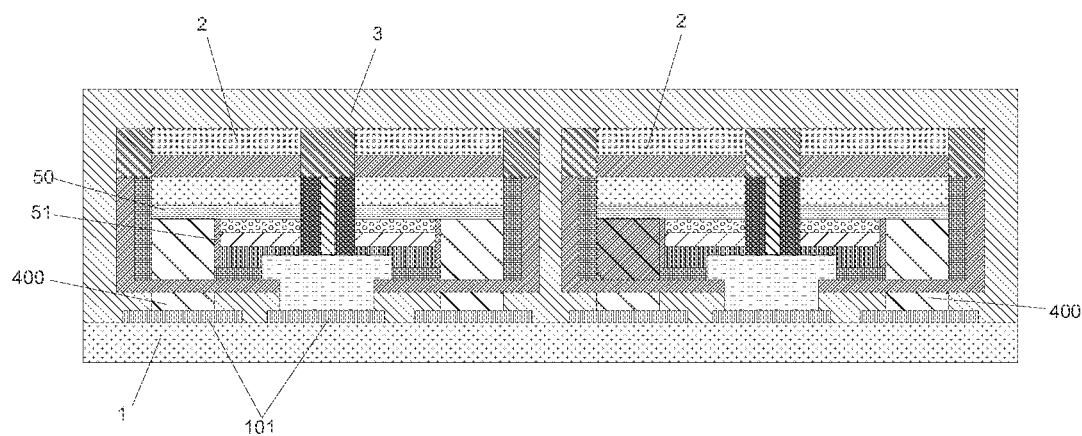
FIG. 11 is a view illustrating the structure of a display panel according to an optional embodiment of the present disclosure.
Figure 12:
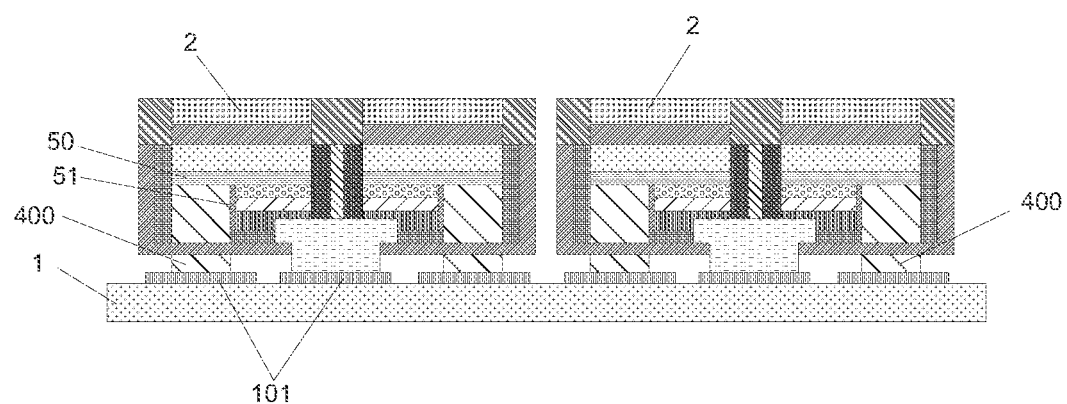
FIG. 12 is a view illustrating the structure of the display panel of FIG. 11 when multiple integrated chips are not encapsulated with an encapsulating adhesive layer.

As shown in FIGS. 8 and 10, the integrated chip 2 further includes multiple light processing portions 200. The multiple light processing portions 200 are distributed on the light-emitting portion 100 in the form of a matrix along a light-emitting surface 204 of the integrated chip and located above the light-emitting layer 10. A plurality of light processing portions 200 are disposed in a one-to-one correspondence with a plurality of light-emitting units. The light-emitting portion 100 further includes a P-GaN layer 30 and a metal contact layer 40 stacked below the light-emitting layer 10, and the metal contact layer 40 is disposed below the P-GaN layer 30. The electrode structure 20 includes a positive electrode 21 and a negative electrode 22. The negative electrode 22 is electrically connected to the light-emitting units. The positive electrode 21 is electrically connected to the light-emitting units through the metal contact layer 40 and the P-GaN layer 30. The integrated chip 2 of this structure has a reasonable structure and stable light emission.

As shown in FIG. 8, the light-emitting portion 100 further includes an n-GaN layer 50, a buffer layer 60 and a first passivation layer 70. The n-GaN layer 50, the buffer layer 60 and the first passivation layer 70 are stacked between the light-emitting layer 10 and the light processing portion 200, and the n-GaN layer 50 is disposed above the light-emitting layer 10, the buffer layer 60 is disposed above the n-GaN layer 50, and the first passivation layer 70 is disposed above the buffer layer 60.

Specifically, the negative electrode of the electrode structure 20 is electrically connected to the n-GaN layer to be electrically connected to the light-emitting unit.

Figure 9:
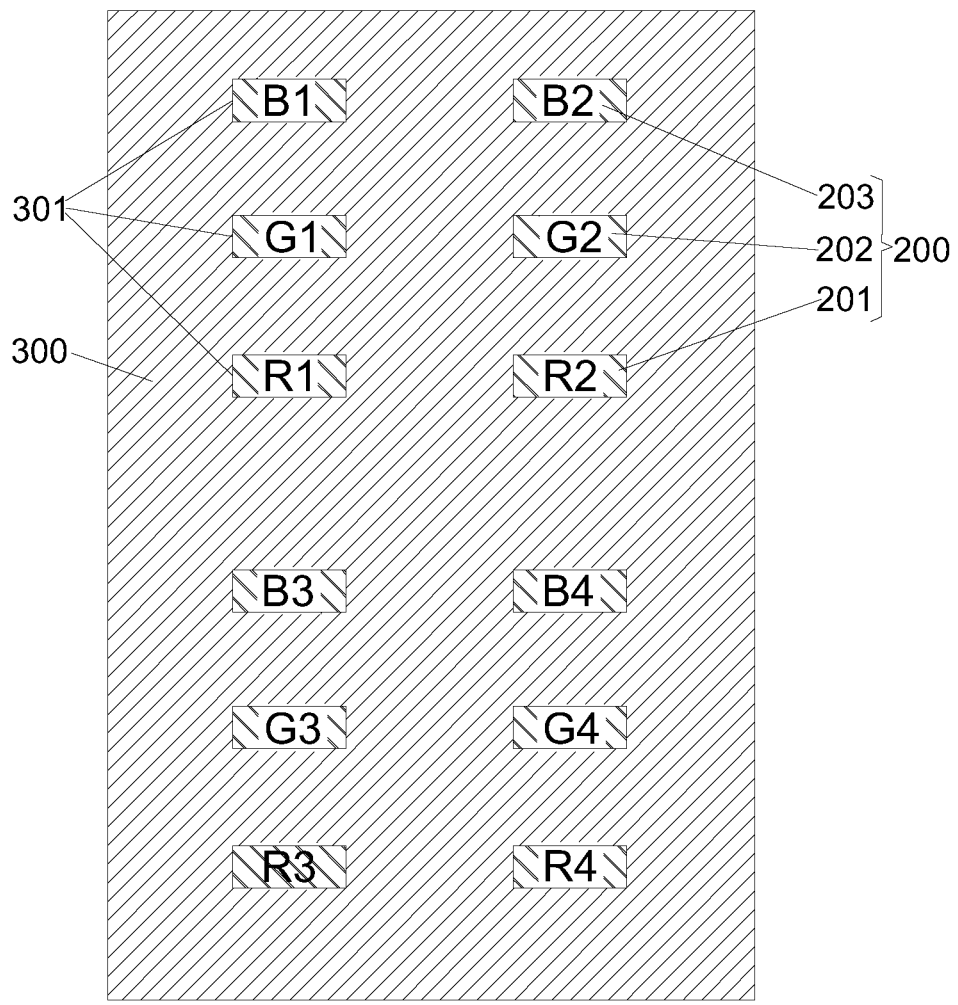
FIG. 9 is a diagram of the state of the integrated chip in FIG. 8 from an overhead viewing angle.

The light-emitting portion 100 further includes a DBR reflective layer 80 and a second passivation layer 90. The DBR reflective layer 80 covers the outer peripheral side of the buffer layer 60, the outer peripheral side of the n-GaN layer 50, the outer peripheral side of the electrode structure 20, and the bottom of the metal contact layer 40. The second passivation layer 90 covers the outer peripheral side of the DBR reflective layer and the bottom of the DBR reflective layer 80. The second passivation layer 90 is one insulating protective layer. As shown in FIG. 9, the full-color integrated chip provided by the present application is the preceding integrated chip 2. The light processing portion 200 of the integrated chip includes a red quantum dot primitive 201, a green quantum dot primitive 202 and a light-transmissive complementary color primitive 203. The bank is disposed between any two adjacent primitives of the red quantum dot primitive 201, the green quantum dot primitive 202 and the light-transmissive complementary color primitive 203.

Optionally, the integrated chip is the blue light integrated chip, and the light-transmissive complementary color primitive 203 is the transparent scattering quantum dot layer.

Optionally, the integrated chip is the ultraviolet integrated chip, and the light-transmissive complementary color primitive 203 is the blue quantum dot layer.

In an illustrated embodiment of the present application, as shown in FIG. 8, the light-emitting portion 100 includes a light-blocking layer 300 located above the light-emitting layer 10. Multiple grooves 301 are formed on the light-blocking layer 300 and distributed in the form of a matrix along the light-emitting surface 204. Each of the red quantum dot primitive 201, the green quantum dot primitive 202 and the light-transmissive complementary color primitive 203, of each light processing portion 200 is disposed in one groove 301.

Optionally, each of the red quantum dot primitive 201, the green quantum dot primitive 202 and the light-transmissive complementary color primitive 203 is formed in a respective corresponding groove 301 by spraying and fills the groove 301.

Optionally, the grooves 301 are formed on the light-blocking layer 300 by photolithography and pass through the light-blocking layer 300.

Optionally, the depth of a groove 301 is greater than or equal to 1 um and less than or equal to 1000 um.

As shown in FIG. 10, in a view illustrating the structure of an integrated chip according to another embodiment of the present disclosure, those skilled in the art know that an insulating member located below the n-GaN layer 50 is a third passivation layer 51. For ease of understanding, the applicant has actively corrected the form of the filler of the n-GaN layer 50 and the filler of the third passivation layer 51 and adds a mark to the insulating member. Based on the same reason, reference numerals are added in FIG. 11 and FIG. 12, and the applicant has actively corrected the form of the filler representing the n-GaN layer 50 and the third passivation layer 51.

It is to be noted that terms used herein are only used to describe specific embodiments and not intended to limit the exemplary embodiments of the present application. As used herein, singular forms are also intended to include plural forms unless clearly expressed in the context. Additionally, it is also to be understood that when terms "comprise" and/or "include" are used in this specification, the presence of features, steps, operations, devices, assemblies and/or combinations therefor is specified.

Unless otherwise specified, the relative arrangement, numerical expressions and numerical values of the components and steps described in these embodiments do not limit the scope of the present disclosure. At the same time, it is to be understood that for ease of description, the dimension of each portion shown in drawings are not drawn according to the actual scale relationship. Techniques, methods, and devices known to those of ordinary skill in the relevant art may not be discussed in detail, but, where appropriate, should be regarded as part of the authorization specification. In all the examples shown and discussed herein, any particular value should be interpreted as merely exemplary and not as a limitation. Thus, other examples of exemplary embodiments may have different values. It is to be noted that similar reference numerals and letters indicate similar items in the subsequent drawings, and thus, once a particular item is defined in one drawing, the item needs no more discussion in subsequent drawings.

For ease of description, spatial relative terms, such as "over", "above", "on the upper surface" and "on", may be used to describe the spatial position relationship between a device or a feature and other devices or features in the drawings. It is to be understood that the spatial relative terms are intended to encompass different orientations in use or operations in addition to the orientations described by the devices in the drawings. For example, if the devices in the drawings are inverted, devices described as "above other devices or constructs" or "over other devices or constructs" will be positioned as "below other devices or constructs" or "under other devices or constructs". Thus, the exemplary term "above" may include two orientations: "above" and "below". The device may also be positioned (rotated 90 degrees or in other orientations) in other different manners, and the spatial relative description used herein is interpreted accordingly.

It is to be noted that terms used herein are only used to describe specific embodiments and not intended to limit the exemplary embodiments of the present application. As used herein, singular forms are also intended to include plural forms unless clearly expressed in the context. Additionally, it is also to be understood that when terms "comprise" and/or "include" are used in this specification, the presence of features, steps, operations, devices, assemblies and/or combinations therefor is specified.

It is to be noted that the terms "first", "second" and the like in the specification, claims and drawings of the present application are used to distinguish between similar objects and are not necessarily used to describe a particular order or sequence. It should be understood that data used in this way is interchangeable when appropriate so that the embodiments of the present application described herein can be implemented in a sequence not illustrated or described herein.

The above are merely preferred embodiments of the present disclosure and not intended to limit the present disclosure. For those skilled in the art, the present disclosure may have various modifications and variations. Any modifications, equivalent substitutions, improvements and the like made within the spirit and principle of the present disclosure are within the scope of the present disclosure.

What is claimed is:

1. A manufacturing method for an integrated chip, the method being used for forming and processing an electrode structure of the integrated chip and the method comprising:

manufacturing a light-emitting portion that comprises n×m light-emitting unit groups distributed in a form of a matrix, wherein n denotes a number of rows, m denotes a number of columns, n and m are each a positive integer greater than or equal to 1, each of the n×m light-emitting unit groups comprises x×y light-emitting units distributed in a form of a matrix, wherein x denotes a number of rows, y denotes a number of columns, and x and y are each a positive integer greater than or equal to 1, and each of the x×y light-emitting units comprises electrode a and electrode b; and electrically connecting electrodes a of a same column of light-emitting units in a same column of light-emitting unit groups to form a same first electrode so that a total of m×y first electrodes are formed, and electrically connecting electrodes b of a same row of light-emitting units in a same row of light-emitting unit groups to form a same second electrode so that a total of n×x second electrodes are formed; and electrically leading out conductive terminals of the m×y first electrodes and conductive terminals of the n×x second electrodes so that m×y first pin electrodes and n×x second pin electrodes are formed, wherein the m×y first pin electrodes and the n×x second pin electrodes are used for being electrically connected to a circuit substrate.

2. The manufacturing method for the integrated chip according to claim 1, wherein the electrodes a of the same column of light-emitting units in the same column of light-emitting unit groups are electrically connected by evaporation or deposition to form the same first electrode so that a total of m×y first electrodes are formed; and the electrodes b of the same row of light-emitting units in the same row of light-emitting unit groups are electrically connected by evaporation or deposition to form the same second electrode so that a total of n×x second electrodes are formed.

3. The manufacturing method for the integrated chip according to claim 1, wherein electrically leading out conductive terminals of the m×y first electrodes and conductive terminals of the n×x second electrodes so that m×y first pin electrodes and n×x second pin electrodes are formed comprises:

electrically leading out conductive terminals of the m×y first electrodes towards edges of the integrated chip so that the m×y first pin electrodes are formed;

electrically leading out conductive terminals of the n×x second electrodes towards edges of the integrated chip so that the n×x second pin electrodes are formed; and sequentially distributing the m×y first pin electrodes and the n×x second pin electrodes at intervals along the edges of the integrated chip.

4. The manufacturing method for the integrated chip according to claim 3, wherein in electrically leading out conductive terminals of the n×x second electrodes towards edges of the integrated chip so that the n×x second pin electrodes are formed, each of m and n is set to 2, x is set to 3, y is set to 1, and conductive terminals of two first electrodes and conductive terminals of six second electrodes are led out towards the edges of the integrated chip so that two first pin electrodes and six second pin electrodes are formed.

5. The manufacturing method for the integrated chip according to claim 1, wherein in electrically leading out conductive terminals of the m×y first electrodes and conductive terminals of the n×x second electrodes so that m×y first pin electrodes and n×x second pin electrodes are formed, N insulating protective layers are formed on surfaces of the first electrodes and the second electrodes of the light-emitting portion by deposition or evaporation; and N metal wiring layers are sequentially formed, by evaporation or deposition, on surfaces of the N insulating protective layers facing away from the first electrodes and the second electrodes, wherein one metal wiring layer is formed on a surface of one insulating protective layer facing away from the first electrodes and the second electrodes, wherein the first electrodes and the second electrodes are electrically connected to the N metal wiring layers through metal vias in the insulating protective layers, wherein N is a positive integer greater than or equal to 2.

6. The manufacturing method for the integrated chip according to claim 5, wherein an insulating layer is disposed on a side of an Nth metal wiring layer of the N metal wiring layers facing away from the N insulating protective layers, and the insulating layer covers metal wiring on the Nth metal wiring layer and metal vias in the Nth metal wiring layer.

7. The manufacturing method for the integrated chip according to claim 5, wherein an Nth metal wiring layer of the N metal wiring layers comprises the m×y first pin electrodes and the n×x second pin electrodes.

8. The manufacturing method for the integrated chip according to claim 5, wherein an identification mark for identifying a polarity of a first pin electrode of the first pin electrodes or a polarity of a second pin electrode of the second pin electrodes is disposed on an insulating protective layer in contact with an Nth metal wiring layer of the N metal wiring layers.

9. The manufacturing method for the integrated chip according to claim 5, wherein the insulating protective layers are silicon dioxide layers or silicon nitride layers.

10. The manufacturing method for the integrated chip according to claim 5, wherein the insulating protective layers are formed by printing or deposition or evaporation.

11. An integrated chip, comprising a light-emitting portion, wherein the light-emitting portion comprises n×m light-emitting unit groups distributed in a form of a matrix, wherein n denotes a number of rows, m denotes a number of columns, n and m are each a positive integer greater than or equal to 1, each of the n×m light-emitting unit groups comprises x×y light-emitting units distributed in a form of a matrix, wherein x denotes a number of rows, y denotes a number of columns, and x and y are each a positive integer greater than or equal to 1, and each of the x×y light-emitting units comprises electrode a and electrode b; and electrodes a of a same column of light-emitting units in a same column of light-emitting unit groups are electrically connected to form a same first electrode so that a total of m×y first electrodes are formed, and electrodes b of a same row of light-emitting units in a same row of light-emitting unit groups are electrically connected to form a same second electrode so that a total of n×x second electrodes are formed; and wherein conductive terminals of the m×y first electrodes and conductive terminals of the n×x second electrodes are electrically led out so that m×y first pin electrodes and n×x second pin electrodes are formed, wherein the m×y first pin electrodes and the n×x second pin electrodes are used for being electrically connected to a circuit substrate.

12. The integrated chip according to claim 11, comprising:

a light-emitting portion, wherein the light-emitting portion comprises a light-emitting layer and an electrode structure, and the electrode structure is electrically connected to the light-emitting layer; and a pin portion, wherein the pin portion is disposed below the electrode structure and electrically connected to the electrode structure; and the pin portion comprises N metal wiring layers and N insulating protective layers stacked in sequence, wherein one insulating protective layer of the N insulating protective layers is disposed between the electrode structure, and one metal wiring layer of the N metal wiring layers adjacent to the electrode structure, one insulating protective layer of the N insulating protective layers is disposed between two adjacent metal wiring layers of the N metal wiring layers, metal vias for conductors to pass through are formed in the insulating protective layers, and the N metal wiring layers are electrically connected by the conductors, wherein N≥2.

13. The integrated chip according to claim 12, wherein the light-emitting layer comprises the n×m light-emitting unit groups distributed in the matrix, wherein n denotes the number of rows, m denotes the number of columns, n and m are each a positive integer greater than or equal to 1, and each of the n×m light-emitting unit groups comprises the x×y light-emitting units distributed in the matrix, wherein x denotes the number of rows, y denotes the number of columns, and x and y are each the positive integer greater than or equal to 1; and the electrode structure comprises electrode groups electrically connected to the x×y light-emitting units in a one-to-one correspondence, wherein each of the electrode groups comprises electrode a and electrode b, the electrodes a of the same column of light-emitting units in the same column of light-emitting unit groups are electrically connected to form the same first electrode so that a total of m×y first electrodes are formed, and electrodes b of the same row of light-emitting units in the same row of light-emitting unit groups are electrically connected to form the same second electrode so that a total of n×x second electrodes are formed.

14. The integrated chip according to claim 13, wherein the pin portion is formed with the m×y first pin electrodes and the n×x second pin electrodes at an Nth metal wiring layer of the N metal wiring layers, wherein the m×y first pin electrodes are connected to the m×y first electrodes in a one-to-one correspondance, and the n×x second pin electrodes are connected to the n×x second electrodes in a one-to-one correspondance.

15. The integrated chip according to claim 13 or 14, wherein N=2, m=2, n=2, x=3, and y=1.

16. The integrated chip according to claim 14, wherein an identification mark for identifying a polarity of a first pin electrode of the first pin electrodes or a polarity of a second pin electrode of the second pin electrodes is disposed on an insulating protective layer in contact with the Nth metal wiring layer.

17. The integrated chip according to claim 12, wherein an insulating layer is disposed on a side of an Nth metal wiring layer of the N metal wiring layers facing away from the N insulating protective layers, and the insulating layer covers metal wiring on the Nth metal wiring layer and metal viasin the Nth metal wiring layer.

18. The integrated chip according to claim 12, wherein the integrated chip further comprises a plurality of light processing portions distributed, in a form of a matrix, on the light-emitting portion along a light-emitting surface of the integrated chip and located above the light-emitting layer, and the plurality of light processing portions are disposed in a one-to-one correspondence with the x×y light-emitting units; the light-emitting portion further comprises a P-GaN layer (30) and a metal contact layer stacked below the light-emitting layer (10), wherein the metal contact layer (40) is disposed below the P-GaN layer; and the electrode structure comprises a positive electrode and a negative electrode-, wherein the negative electrode is electrically connected to the x×y light-emitting units, and the positive electrode is electrically connected to the x×y light-emitting units through the metal contact layer and the P-GaN layer.

19. The integrated chip according to claim 18, wherein the light-emitting portion further comprises an n-GaN layer, a buffer layer and a first passivation layer, wherein the n-GaN layer, the buffer layer and the first passivation layer are stacked between the light-emitting layer (10) and the light processing portion, the n-GaN layer is disposed above the light-emitting layer, the buffer layer is disposed above the n-GaN layer, and the first passivation layer is disposed above the buffer layer; and the light-emitting portion further comprises a DBR reflective layer and a second passivation layer, wherein the DBR reflective layer covers an outer peripheral side of the buffer layer, an outer peripheral side of the n-GaN layer, an outer peripheral side of the electrode structure, and a bottom of the metal contact layer; the second passivation layer covers an outer peripheral side of the DBR reflective layer and a bottom of the DBR reflective layer; and the second passivation layer is one insulating protective layer of the N insulating protective layers.

20. A full-color integrated chip, comprising:
the integrated chip according to claim 11; and
a light processing portion disposed above the integrated chip, wherein the light processing portion comprises a red quantum dot primitive, a green quantum dot primitive and a light-transmissive complementary color primitive, and a bank is disposed between any two adjacent primitives of the red quantum dot primitive, the green quantum dot primitive and the light-transmissive complementary color primitive.

* * * * *